United States Patent [19]
Stevens et al.

[11] Patent Number: 5,926,727
[45] Date of Patent: Jul. 20, 1999

[54] PHOSPHOROUS DOPING A SEMICONDUCTOR PARTICLE

[76] Inventors: Gary Don Stevens, 18912 Ravenglen Ct, Dallas, Tex. 75287; Jeffrey Scott Reynolds, 703 Horizon, Murphy, Tex. 75094

[21] Appl. No.: 08/570,028

[22] Filed: Dec. 11, 1995

Related U.S. Application Data

[51] Int. Cl.$^6$ .................................................. H01L 21/22
[52] U.S. Cl. ........................................... 438/564; 438/567
[58] Field of Search .................................... 437/160, 162, 437/163, 164, 165, 166, 168, 169; 438/558, 560, 563, 564, 566, 567, 568

[56] References Cited

U.S. PATENT DOCUMENTS

| | | | |
|---|---|---|---|
| 2,974,073 | 3/1961 | Armstrong | 437/164 |
| 3,914,138 | 10/1975 | Rai-Choudhury | 437/163 |
| 5,028,546 | 7/1991 | Hotchkiss | 437/2 |
| 5,223,452 | 6/1993 | Knepprath | 437/168 |
| 5,432,127 | 7/1995 | Lamson et al. | 437/182 |
| 5,556,791 | 9/1996 | Stevens et al. | 437/4 |

OTHER PUBLICATIONS

Appl. 08/570,070 Filed Dec. 11, 1995 by Stevens et al.

*Primary Examiner*—Chandra Chaudhari
*Attorney, Agent, or Firm*—Robert C. Klinger; R. Craig Armstrong

[57] ABSTRACT

A method (10) of phosphorus doping a semiconductor particle using ammonium phosphate. A p-doped silicon sphere is mixed with a diluted solution of ammonium phosphate having a predetermined concentration. These spheres are dried (16, 18), with the phosphorus then being diffused (20) into the sphere to create either a shallow or deep p-n junction. A good PSG glass layer is formed on the surface of the sphere during the diffusion process. A subsequent segregation anneal process is utilized to strip metal impurities from near the p-n junction into the glass layer. A subsequent HF strip procedure is then utilized to removed the PSG layer. Ammonium phosphate is not a restricted chemical, is inexpensive, and does not pose any special shipping, handling, or disposal requirement.

11 Claims, 1 Drawing Sheet

PHOSPHOROUS DOPING A SEMICONDUCTOR PARTICLE

CROSS REFERENCE TO RELATED APPLICATIONS

Cross reference is made to commonly assigned co-pending patent application Attorney Docket No. TI-19673 entitled "Boron Doping a Semiconductor Particle", filed herewith and the teachings incorporated herein by reference.

The Government of the United States of America has rights in this invention pursuant to Subcontract No. ZAI-4-11294-04 awarded by the U.S. Department of Energy.

TECHNICAL FIELD OF THE INVENTION

The present invention is generally related to the manufacture of photovoltaic cells or solar cells, and more particularly to a method of doping a semiconductor particle such as a silicon sphere with phosphorus to create a p-n junction.

BACKGROUND OF THE INVENTION

Solar cells are photovoltaic devices which convert the sun's solar energy into useful electrical energy. These solar cells may comprise a matrix or array of doped semiconductor spheres embedded in a light-reflective aluminum foil, the semiconductor material typically comprising silicon. One such solar cell is disclosed in U.S. Pat. No. 5,028,546 to Hotchkiss, entitled "Method for Manufacture of Solar Cell with Foil Contact Point", assigned to the same assignee of the present invention, the teachings of this patent incorporated herein by reference. These solar cells typically are composed of a transparent matrix provided with spheroidal particles of silicon, each particle having a p-region exposed on one matrix surface, and an n-type region extending to an opposed matrix surface. Electrical energy is produced when photons of light strike the silicon sphere, inducing electrons to cross the depletion region between the two conductivity types.

To create the n-region in the silicon sphere, the spheres are doped, typically with phosphorus. Several sources are available for doping these spheres with phosphorus, however, not all phosphorus doping sources will create an adequate phosphorus rich glass (PSG) on the silicon surface during diffusion for impurity gettering. In addition, the prior art phosphorus sources typically are restricted chemicals and require special shipping, handling, and disposal requirements. In addition, the cost of these phosphorus sources is relatively expensive.

It is desired to fabricate an n-type layer on a p-type semiconductor particle having a resistivity range which provides maximum solar conversion efficiency. The method for creating the n-type layer would preferably be derived from a dopant source that is not a restricted chemical nor poses any special shipping, handling or disposal requirements. The method should cost significantly less than other methods, and create a PSG layer on the silicon surface during diffusion.

SUMMARY OF THE INVENTION

The present invention achieves technical advantages by utilizing ammonium phosphate as a dopant source and diluting it with deionized water. Ammonium phosphate is a low cost commercially available product that is not a restricted chemical, nor does it pose any special shipping, handling or disposal requirements. A good PSG is left on the silicon following diffusion.

The present invention comprises the steps of first creating a diluted solution of phosphorus dopant, preferably comprised of ammonium phosphate and deionized water. The chosen concentration of the solution depends on whether a small amount of liquid is to be tumble dried onto the sphere surfaces to obtain a shallow p-n junction, or a bakeout is to be used on spheres immersed in a larger volume of liquid to obtain a deep p-n junction.

In the first instance, the silicon spheres are tumble dried in the concentrated solution to improve the uniformity of the doping film on the surface of the spheres. Next, the spheres are heated to an elevated temperature for a predetermined period of time to diffuse the phosphorus into the surface of the sphere and obtain a shallow p-n junction, preferably having a depth of 0.8 to 1.0 microns.

In the second instance, when spheres are immersed with a diluted solution of ammonium phosphate, a larger volume of more dilute solution is utilized than that used for the tumble dry procedure. Although the 120° C. bake does not provide uniform coverage of the dopant in the container, the longer diffusion times allow the $NH_4H_2PO_4$ vapor to reach all surfaces in adequate time. The longer diffusion time creates a deep p-n junction, having a depth of between 1.5 and 2.0 microns.

During the diffusion process, a PSG layer forms on the surface of the sphere. After the diffusion process, which is typically performed at 950° Celsius, a segregation anneal process is performed by heating the spheres to about 800° Celsius for a predetermined period of time, typically two hours. At this temperature, no significant change in junction depth occurs. This anneal process strips metal impurities from the silicon bulk near the p-n junction and draws the impurities into the PSG. Thereafter, a 5% hydrofluoric acid (HF) clean/strip procedure is performed to remove the PSG coating and gettered impurities.

DETAIL DESCRIPTION OF THE PREFERRED EMBODIMENT

Figure 1:
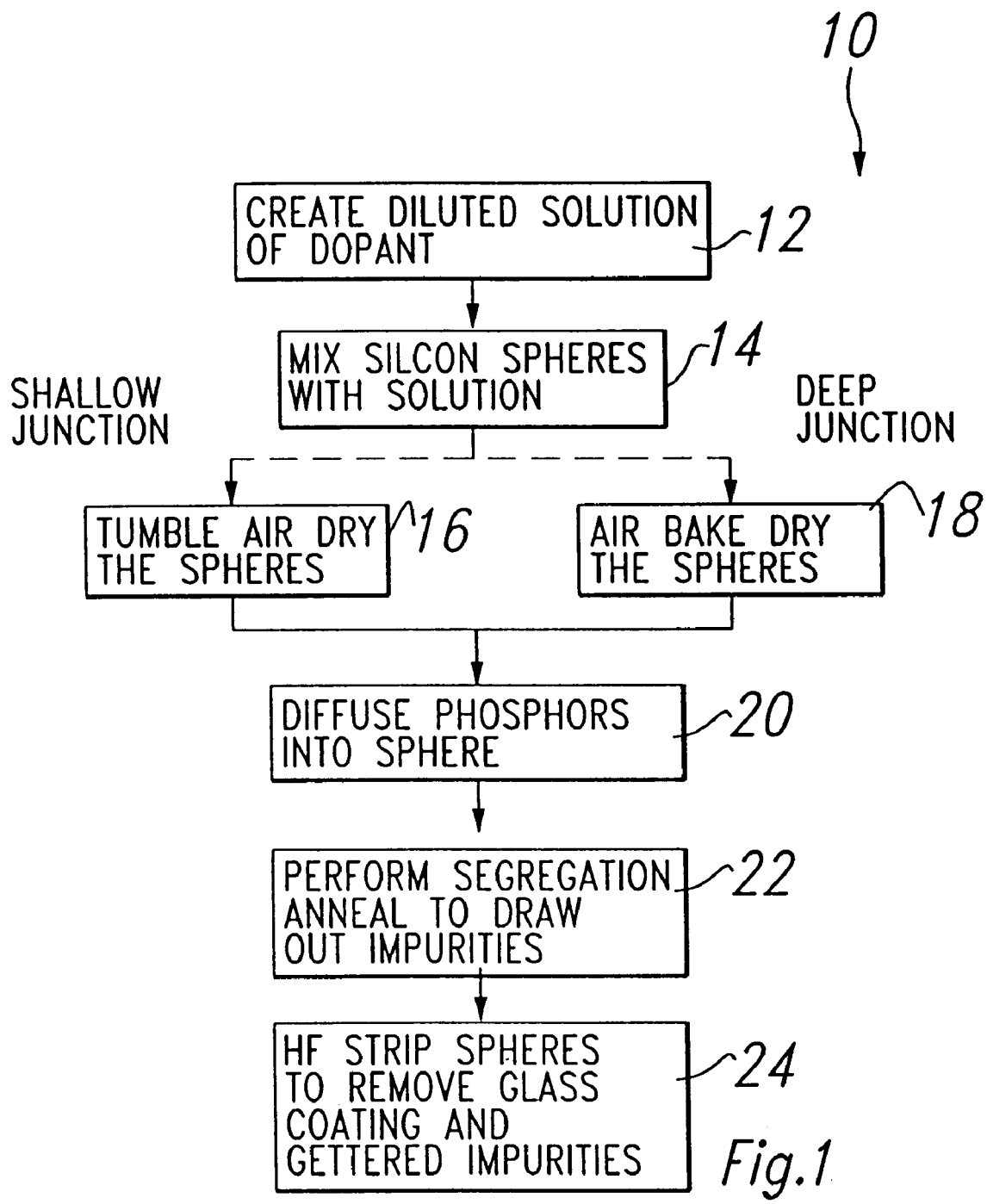
FIG. 1 is a flow diagram of the preferred embodiment of the present invention, illustrating a method of creating a phosphorus layer over a p-doped silicon sphere to form either a shallow p-n junction or a deep p-n junction.

Referring now to FIG. 1, there is generally shown at 10 a flow diagram of the preferred embodiment of the present invention. This process is utilized to diffuse an n-type material into a p-type silicon sphere and create either a shallow or a deep p-n junction. By controlling the amount of dopant and the time of diffusion, the depth of the p-n junction can be controlled.

At step 12, a diluted n-type dopant solution is created using off-the-shelf ammonium phosphate ($NH_4 H_2PO_4$) and deionized water, to create a solution having a desired concentration. If a shallow p-n junction is to be created in the sphere, that is, a junction having a depth of about 0.8 to 1.0 microns, a 5% solution is created. If, however, a deeper p-n junction is to be formed, a more dilute solution is created, preferably having a concentration of about 1%.

Next, at step 14, a predetermined quantity of p-doped (preferably boron) silicon spheres is mixed in with the solution formed in step 12. If a shallow p-n junction is to be formed, approximately 5 to 10 milliliters of 5% solution is mixed with about 1 kilogram of spheres. However, if a deeper junction is to be formed, having a depth between 1.5 and 2.0 microns, approximately 150 to 250 milliliters of 1% solution is added to one kilogram. of spheres.

At step 16, if it is desired to form a shallow p-n junction, the mixture of spheres and solution is tumbled air dried for about one hour. This tumbled air dry procedure helps uniformly coat these spheres with the ammonium phosphate solution. If a deeper p-n junction is to be formed, step 18 is performed instead, whereby these spheres having been immersed in a more dilute solution are simply air baked dry at 120° Celsius for about three hours. The ammonium phosphate solution will not be as uniformly covered about the spheres after step 18, however, this is not as crucial as will be discussed shortly.

Next, at step 20, the coating of ammonium phosphate is diffused into the spheres by heating these spheres to about 950° Celsius. To form a shallow p-n junction, these spheres are heated for approximately 30 to 45 minutes. However, to create a deeper p-n junction, these spheres are heated at 950° Celsius for between one and two hours. In the case of the shallow p-n junction, the tumble air dry procedure of step 16 was necessary to first uniformly coat the spheres with dopant since the diffusion process is short. The tumble air dry procedure facilitates drying and insures a suitable and uniform coating of the n-type phosphorus onto the p-doped sphere, preferably doped with boron.

To create a deeper p-n junction, the longer diffusion time is performed, with a depth being in the range of 1.5 to 2.0 microns. Referring back to step 18, the air bake dry procedure is all that is required to coat the sphere surfaces with ammonium phosphate prior to the long diffusion process. This is because although the ammonium phosphate is initially unevenly distributed about the spheres, during the diffusion process of step 20, ammonium phosphate dissociates to $NH_4$ and $H_3PO_4$ at 400° Celsius. At 875° Celsius, the $H_3PO_4$ becomes a low pressure vapor. During the diffusion process, with the spheres being in a covered container, the $H_3PO_4$ having attained the vapor state will sufficiently cover the spheres and uniformly diffuse into the spheres.

At step 22, a segregation anneal process is performed to strip metal impurities from the bulk silicon n-diffusion proximate to the p-n junction. The metal impurities are drawn from the silicon n-type diffusion to a PSG glass layer which was formed on the surface of the sphere during the diffusion process of step 20. The segregation anneal step is performed by heating the spheres to 800° Celsius for two hours, which is a temperature insufficient drive the junction significantly.

Finally, at step 24, a 5% hydrofluoric acid (HF) strip is performed to remove the PSG glass coating from the spheres, and thus, the impurities are removed therewith. In summary, according to the method of the present invention shown at 10, an n-type diffusion is created in a p-type silicon sphere, whereby a p-n junction is formed at a selected depth.

One of the technical advantages of using ammonium phosphate over other phosphorus doping sources is that a good PSG glass layer is formed on the surface of the sphere during the diffusion process. Again, this PSG layer is later used during the segregation anneal step to draw out metal impurities that are proximate to the p-n junction. Another technical advantage of the present invention is that ammonium phosphate is not a restricted chemical and it does not pose any special shipping, handling, or disposal requirements allows precise control of the phosphorus concentration giving desired electrical characteristics while minimizing damage to the silicon. The cost of ammonium phosphate is significantly less than the cost of other commercially available phosphorus doping products, and is available off-the-shelf. Ammonium phosphate is easily diluted using deionized water, and a desired concentration can be easily obtained. This provides a dopant source that is free of volatile organic compounds.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications. For instance, limitation to the specific concentrations of ammonium phosphate, the mixture of spheres to solution, the diffusion time and temperature, and the segregation anneal time and temperature, is not to be inferred, as different depths of the p-n junction can be obtained as desired for the particular application.

We claim:

1. A method of doping a semiconductor particle, comprising the steps of:

a) preparing a diluted aqueous solution including a compound comprising ammonium phosphate;

b) mixing the semiconductor particle with the solution to coat the particle with the ammonium phosphate;

c) drying the particle; and d) diffusing the phosphorus from the ammonium phosphate into said particle.

2. The method as specified in claim 1 wherein the compound comprises ammonium phosphate.

3. The method as specified in claim 1 wherein the compound is diluted in deionized water.

4. The method as specified in claim 1 wherein the particle comprises a sphere.

5. The method as specified in claim 1 wherein the particle comprises silicon.

6. The method as specified in claim 1 wherein the concentration of the ammonium phosphate is between about 10 grams/liter and 50 grams/liter.

7. The method as specified in claim 1 comprising the step of diffusing the phosphorus into the particle by heating the particle to a temperature of between approximately 875° C. and 975° C.

8. The method as specified in claim 1 further comprising the step of performing a segregation anneal step to pull impurities from said particle into a glass layer formed on the surface of the particle during the diffusion step.

9. The method as specified in claim 8 further comprising the step of removing the glass layer from the particle.

10. The method as specified in claim 9 wherein the glass layer is removed using HF acid.

11. The method as specified in claim 1 wherein the particle is dried using a tumble dry technique to uniformly coat the particle with the ammonium phosphate.

* * * * *